(12) United States Patent
Yan

(10) Patent No.: US 7,480,985 B2
(45) Date of Patent: Jan. 27, 2009

(54) CPU PICKUP DEVICE

(75) Inventor: Jia-Yi Yan, Shenzhen (CN)

(73) Assignees: Hong Fu Jin Precision Industry (Shenzhen) Co., Ltd., Guangdong Province (CN); Hon Hai Precision Industry Co., Ltd., Taipei Hsien (TW)

( * ) Notice: Subject to any disclaimer, the term of this patent is extended or adjusted under 35 U.S.C. 154(b) by 383 days.

(21) Appl. No.: 11/145,106

(22) Filed: Jun. 3, 2005

(65) Prior Publication Data

US 2006/0103153 A1    May 18, 2006

(30) Foreign Application Priority Data

Sep. 6, 2004    (CN) .......................... 2004 2 0839723

(51) Int. Cl.
*H05K 13/04* (2006.01)

(52) U.S. Cl. .............................. 29/740; 29/739; 29/743; 294/64.1

(58) Field of Classification Search .................. 29/729, 29/739, 740–743, 759–764; 294/64.1, 64.3, 294/65, 907; 414/627, 737, 752.1; 901/40, 901/46

See application file for complete search history.

(56) References Cited

U.S. PATENT DOCUMENTS

| 4,494,902 | A  | * | 1/1985  | Kuppens et al. ................ 221/74 |
| 4,631,816 | A  | * | 12/1986 | Fujita et al. .................... 29/740 |
| 4,763,491 | A  | * | 8/1988  | Wilson et al. .................. 66/146 |
| 5,673,844 | A  | * | 10/1997 | Sargent ....................... 228/102 |
| 5,961,168 | A  | * | 10/1999 | Kanno ........................ 294/64.1 |
| 6,364,387 | B1 | * | 4/2002  | Bolotin et al. ............. 294/64.1 |
| 6,457,759 | B1 | * | 10/2002 | Unokuchi ................... 294/64.1 |
| 6,499,644 | B2 | * | 12/2002 | Cox et al. ...................... 228/19 |
| 6,606,790 | B2 |   | 8/2003  | Hildese ........................ 29/832 |
| 2006/0103153 | A1 | * | 5/2006 | Yan ............................. 294/164 |

\* cited by examiner

*Primary Examiner*—Minh Trinh
(74) *Attorney, Agent, or Firm*—Morris Manning Martin LLP; Tim Tingkang Xia, Esq.

(57) ABSTRACT

A CPU pickup device for mounting a CPU (50) to a socket (61) includes a main body (10), a suction piece (20) and a positioning mechanism (30). The suction piece is attached to the main body. The suction piece includes a suction cup (21) for picking up the CPU by means of compelling air out from the suction cup via the main body. The positioning mechanism is attached to the main body for engaging the socket to align the CPU with the socket.

3 Claims, 5 Drawing Sheets

CPU PICKUP DEVICE

BACKGROUND OF THE INVENTION

1. Field of the Invention

The present invention relates to a CPU pickup device.

2. General Background

In computer industry, central processing units (CPUs) are typically picked up by hand and mounted to CPU sockets of printed circuit boards. However, CPUs are liable to be contaminated and damaged due to individual inadvertence in assembly.

What is desired, therefore, is a CPU pickup device which improves CPU mounting quality.

SUMMARY

In one preferred embodiment, a CPU pickup device for mounting a CPU to a socket includes a main body, a suction piece and a positioning mechanism. The suction piece is arranged to the main body. The suction piece includes a suction cup for picking up the CPU by means of compelling air out from the suction cup via the main body. The positioning mechanism is arranged to the main body for engaging the socket to align the CPU with the socket.

Other advantages and novel features will become more apparent from the following detailed description of a preferred embodiment when taken in conjunction with the accompanying drawings, in which:

DETAILED DESCRIPTION OF THE EMBODIMENT

Figure 1:
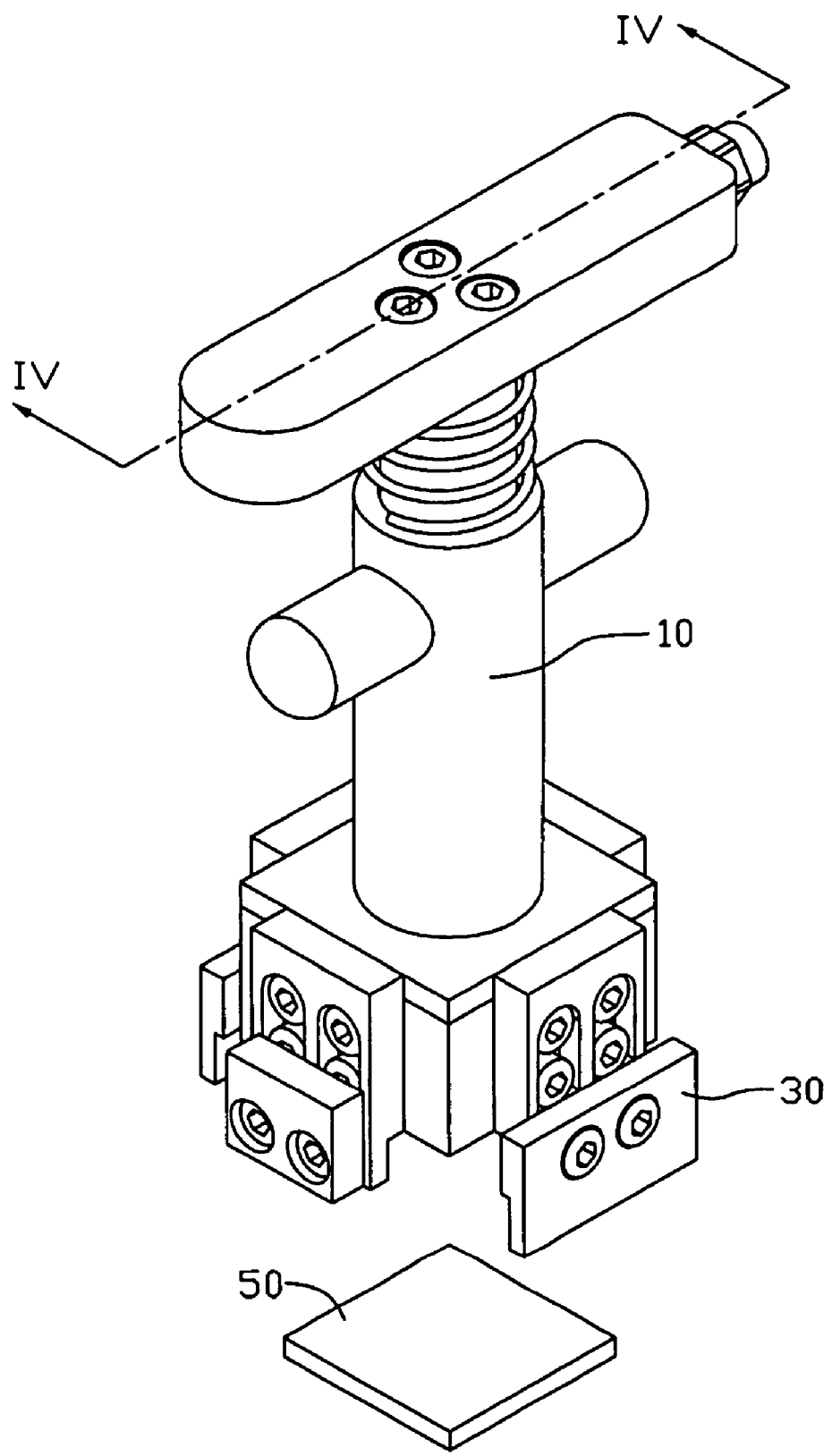
FIG. 1 is an isometric view of a CPU pickup device and a CPU in accordance with a preferred embodiment of the present invention.
Figure 2:
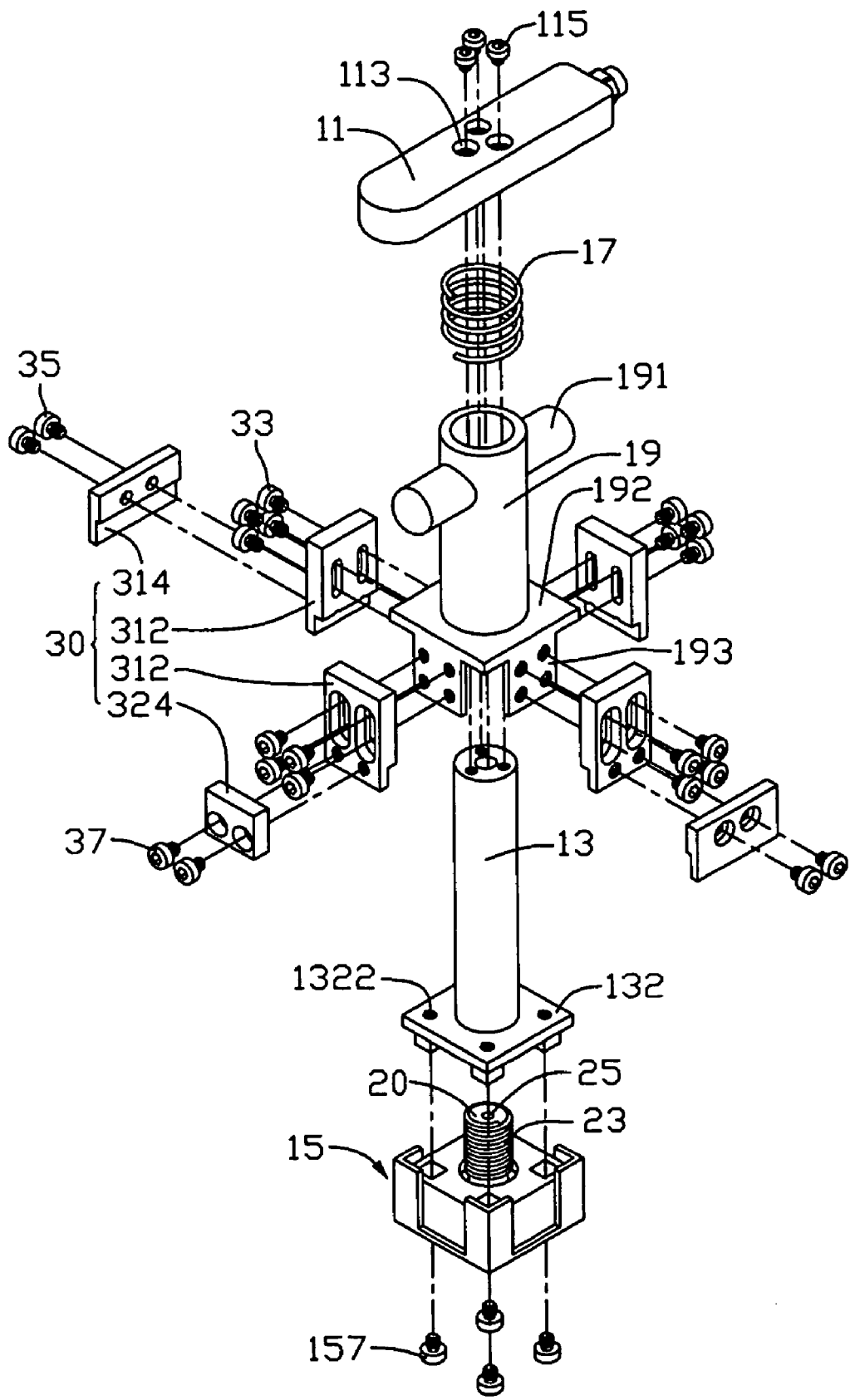
FIG. 2 is an exploded, isometric view of the CPU pickup device of FIG. 1, the CPU pickup device including a handle, a coil spring, a cylinder piece, a connecting piece, a base, a suction piece and a positioning mechanism.

Referring to FIGS. 1 and 2, a pickup device for picking up an electronic component like a central processing units (CPU) includes a main body 10, a suction piece 20 and a positioning mechanism 30, and the CPU pickup device is for mounting a CPU 50 to an corresponding electrical connection like a socket 63 formed on a printed circuit board (PCB) 60 (see FIG. 5) for the CPU 50.

Figure 3:
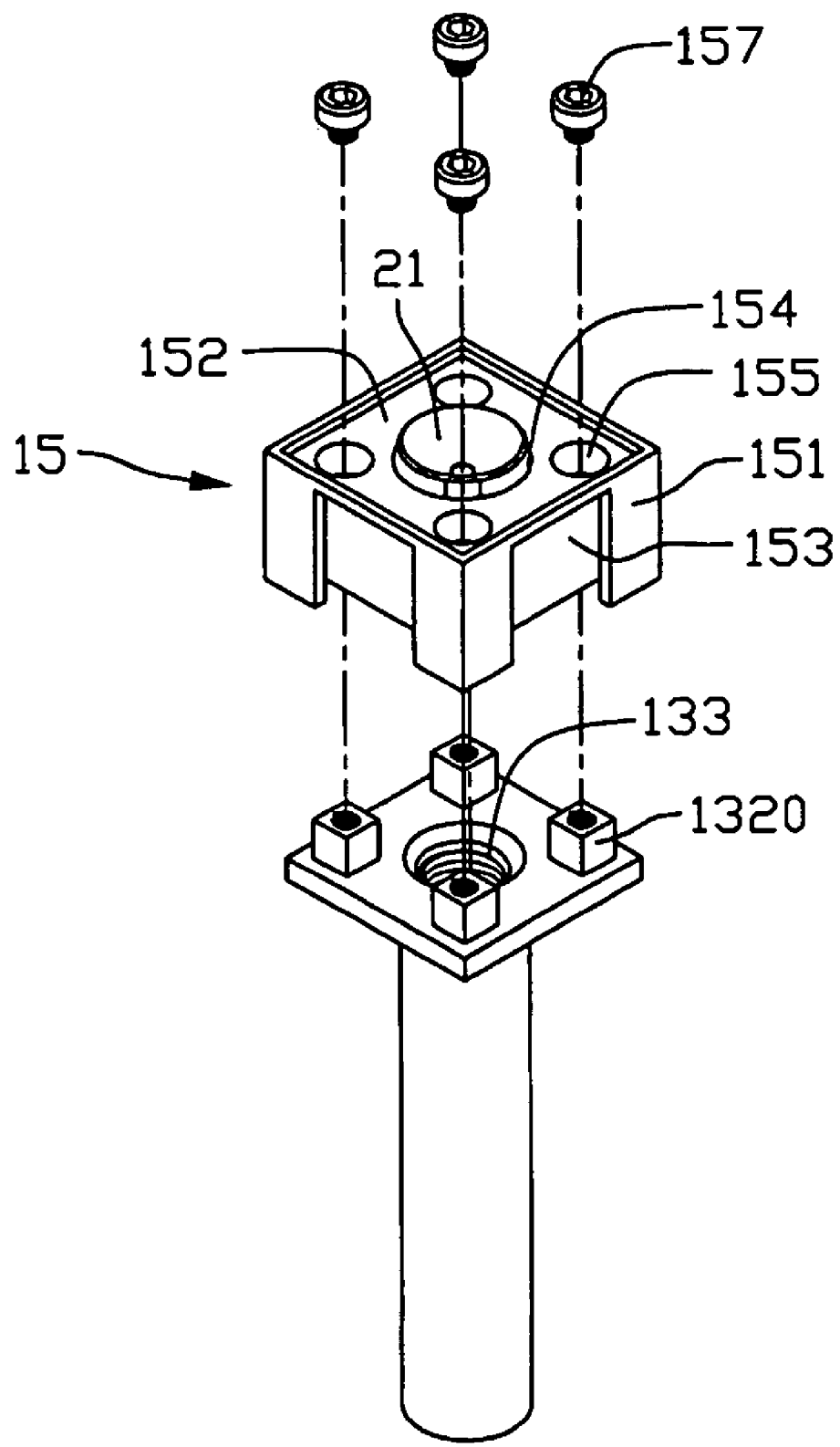
FIG. 3 is an isometric view of the connecting piece, the base and the suction piece of FIG. 2, but viewed from another aspect.
Figure 4:
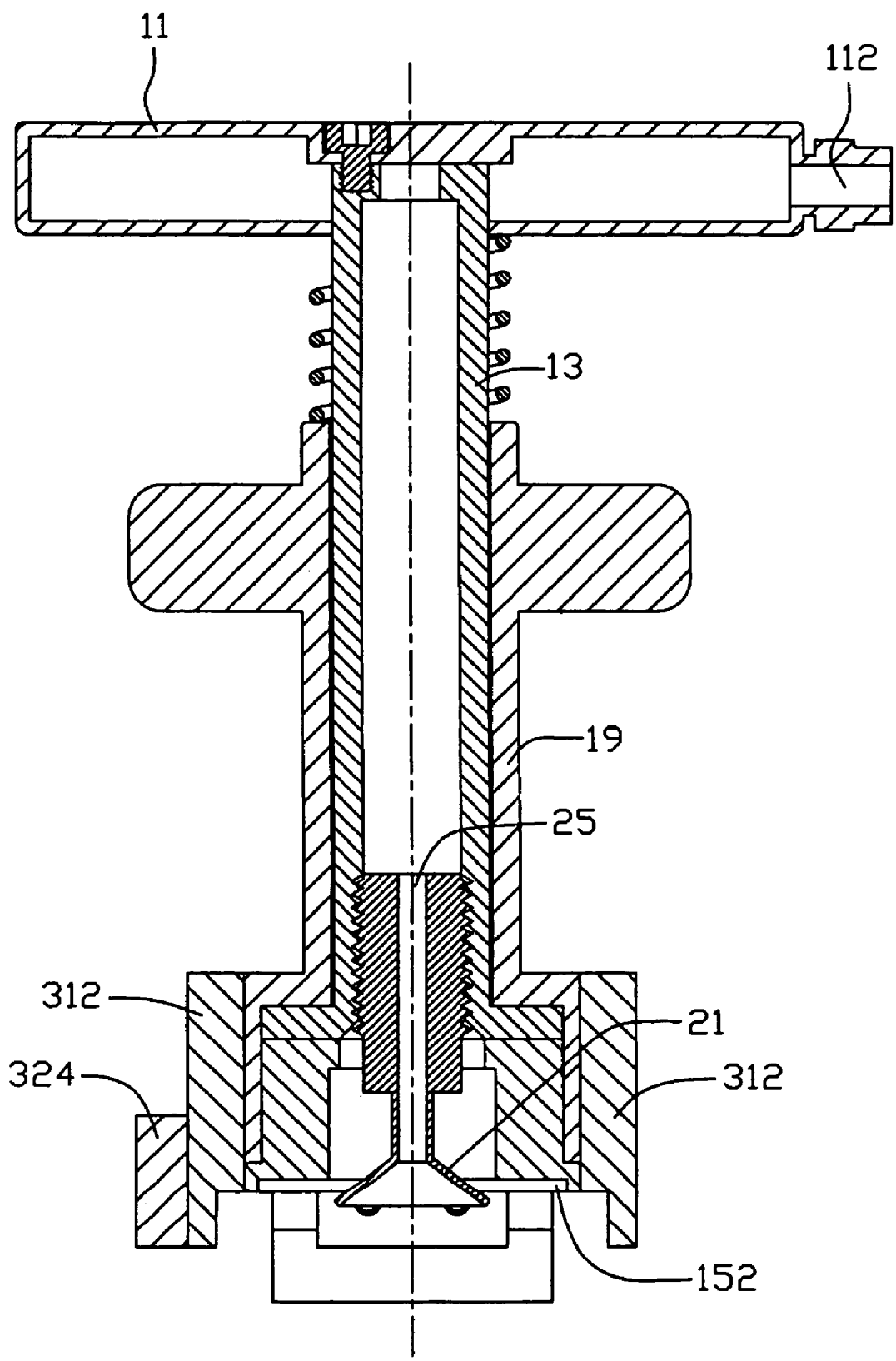
FIG. 4 is a cross-sectional view taken along line IV-IV of FIG. 1.

Referring to FIGS. 2 to 4, the main body 10 includes a hollow handle 11 for facilitating manipulating the CPU pickup device. An air vent 112 is defined in an end of the handle 11 in communication with a cavity thereof, and the handle 11 is connected to a vacuum generator (not shown) via the air vent 112. A plurality of holes 113 is defined in a middle portion of the main body 10. A hollow connecting piece 13 is inserted through a cylinder piece 19 and a coil spring 17 and attached to the handle 11 with a plurality of screws 115 being extended through the holes 113 respectively and engaged in a top end of the connecting piece 13. A cavity of the connecting piece 13 communicates with the cavity of the handle 11. The connecting piece 13 includes a rectangle pedestal portion 132, and four parallelepiped portions 1320 depend from a bottom surface of the pedestal portion 132 at four corners respectively. Four threaded holes 1322 are defined through the pedestal portion 132 and the parallelepiped portions 1320 respectively. A threaded portion 133 is formed at a bottom portion of the cavity of the connecting piece 13. Two handgrips 191 are formed on an external surface adjacent a top end of the cylinder piece 19. A rectangle base plate 192 is integrally formed at a bottom end of the cylinder piece 19. Four spaced supporting plates 193 depend from four edges of the base plate 192 respectively.

A base 15 is attached to the pedestal portion 132 of the connecting piece 13. A concave portion 152 is defined at a bottom surface of the base 15. Four L-shaped stoppers 151 are arranged along four upright edges of the base 15 respectively, with top portions of the stoppers 151 respectively extended beyond a top surface of the base 15. Four notches 153 are defined adjacent four lateral sides of the base 15. A through hole 154 is defined in a central portion of the base 15, through which the suction piece 20 is extended. Four apertures 155 are defined through four corners of the base 15 respectively, and four screws 157 are extended through the apertures 155 and engaged in the threaded holes 1322 of the pedestal portion 132 respectively to fix the base 15 to the connecting piece 13. The parallelepiped portions 1320 of the pedestal portion 132 are received in the apertures 155 of the base 15 respectively. The pedestal portion 132 engages the stoppers 151 of the base 15. The supporting plates 193 of the cylinder piece 19 are received in the notches 153 of the base 15 respectively.

The suction piece 20 includes a threaded rod 23 and a suction cup 21 connected to the rod 23. A through hole 25 is defined in the rod 23 communicating with the suction cup 21. The suction piece 20 is extended through the through hole 154 of the base 15 and connected to the connecting piece 13 with the rod 23 engaging in the threaded portion 133 of the connecting piece 13.

The positioning mechanism 30 includes four first positioning pieces 312 each attached to a corresponding supporting plate 193 of the cylinder piece 19 with screws 33, each first positioning piece 312 defining a stepped portion facing corresponding supporting plate 193. Two second positioning pieces 314 are attached to two selected opposite first positioning pieces 312 respectively with screws 35, each second positioning piece 314 defining a stepped portion facing corresponding first positioning piece 312. A foolproof piece 324 is attached to one selected first positioning piece 312 other than said two selected first positioning pieces 312 with screws 37.

In use, the CPU pickup device is moved to the CPU 50 ready to be attached to a socket 63 of the PCB 60. The handle 11 is pushed downward to extend the suction cup 21 of the suction piece 20 out of the cylinder piece 19. The coil spring 17 is compressed. The suction cup 21 of the suction piece 20 contacts an upper surface of the CPU 50, and air in the suction cup 21 is expelled out by the vacuum generator via the through hole 25 of the suction piece 20, the cavities of the connecting piece 13, handle 11, and the air vent 112 of the handle 11. The suction cup 21 tightly engages the upper surface of the CPU 50 because of difference between external and internal pressures of the suction cup 21. The handle 11 is released, and the coil spring 17 is restored to push the handle 11 upwardly. The CPU 50 is thus drawn upwardly in the concave portion 152 of the base 15 by the suction cup 21.

Figure 5:
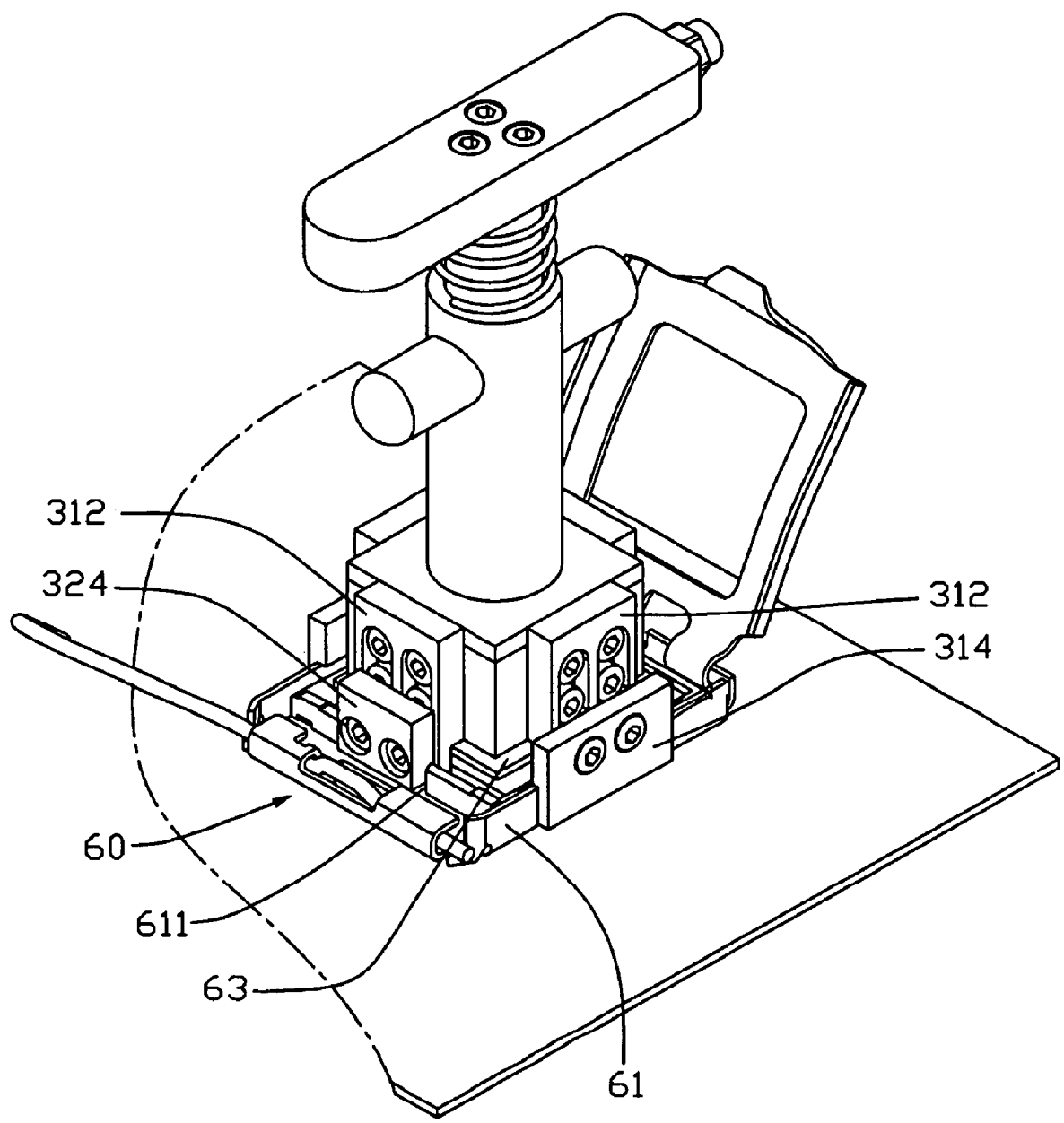
FIG. 5 is an isometric view of the CPU pickup device in use with a printed circuit board.

Referring to FIG. 5, the pickup device together with the CPU 50 is moved to the socket 63 of the PCB 60. The stepped portions of the first positioning pieces 312 are seated on edge portions of the socket 63 respectively, the stepped portions of the second positioning pieces 314 are seated on a bracket 61 enclosing the socket 63, and the foolproof piece 324 is located in a cutout 611 of the bracket 61. Air is then conducted through the air vent 112 of the handle 11, the cavities of the connecting piece 13, handle 11, the through hole 25 in the suction cup 21 to balance external and internal pressures of the suction cup 21, and the suction cup 21 disengages from the CPU 50. The CPU 50 falls from the concave portion 152 of the base 15 and fits in the socket 63. The pickup piece is ready to be move away from the socket 63.

It is believed that the present embodiment and its advantage will be understood from the foregoing description, and it will be apparent that various changes may be made thereto without departing from the spirit and scope of the invention or sacrificing all of its material advantages, the example hereinbefore described merely being preferred or exemplary embodiment.

What is claimed is:

1. A CPU pickup device comprising:
    a cylinder piece;
    a hollow connecting piece slidably received in the cylinder piece; and
    a suction piece arranged to the connecting piece at one end thereof, the suction piece comprising a suction cup at another end thereof and defining a through hole communicating with the connecting piece and the suction cup, air in the suction cup being expelled out from the connecting piece for picking up a CPU with the suction cup, wherein a handle is attached to a top end of the connecting piece, the handle defines a cavity therein in communication with a cavity in the connecting piece, and an air vent in one end thereof in communication with the cavity of the handle, a plurality of first positioning pieces is attached to a bottom portion of the cylinder piece, and each of the first positioning pieces comprises a stepped portion for seating on a CPU socket, two second positioning pieces are arranged to two selected opposite first positioning pieces respectively, and each of the second positioning pieces comprises a stepped portion for seating on a bracket enclosing the CPU socket, a foolproof piece is arranged to another of the first positioning pieces and is for being located in a cutout of the bracket.

2. The CPU pickup device as claimed in claim 1, wherein a coil spring is located between the handle and the cylinder piece, and a top portion of the connecting piece is extended through the coil spring.

3. The CPU pickup device as claimed in claim 1, wherein a base is arranged to a bottom portion of the connecting piece, a concaved portion is defined in a bottom surface of the base for receiving the CPU, and said one end of the suction piece is extended through the base.

* * * * *